United States Patent [19]
Gilbert

[11] Patent Number: 5,298,811
[45] Date of Patent: Mar. 29, 1994

[54] SYNCHRONOUS LOGARITHMIC AMPLIFIER

[75] Inventor: Barrie Gilbert, Portland, Oreg.

[73] Assignee: Analog Devices, Inc., Norwood, Mass.

[21] Appl. No.: 924,325

[22] Filed: Aug. 3, 1992

[51] Int. Cl.[5] .................. G06F 7/556; G06G 7/24; H03K 5/02
[52] U.S. Cl. .................. 307/492; 328/145; 333/14
[58] Field of Search .......... 307/490, 492; 328/145, 328/142; 333/14

[56] References Cited

U.S. PATENT DOCUMENTS

| | | | |
|---|---|---|---|
| 3,435,353 | 3/1969 | Sauber | 328/145 |
| 3,584,232 | 6/1971 | Wallace, Jr. | 307/229 |
| 3,605,027 | 9/1971 | Nichols et al. | 328/145 |
| 3,668,535 | 6/1972 | Lansdowne | 329/192 |
| 3,745,474 | 7/1973 | Hughes | 307/492 |
| 4,090,150 | 5/1978 | Vachenauer | 328/145 |
| 4,333,023 | 6/1982 | Hood, Jr. | 307/310 |
| 4,565,935 | 1/1986 | Rolfe | 307/491 |
| 4,604,532 | 8/1986 | Gilbert | 307/490 |
| 4,990,803 | 2/1991 | Gilbert | 307/492 |
| 5,049,829 | 9/1991 | Garskamp et al. | 328/145 |
| 5,057,717 | 10/1991 | Kimura | 307/492 |
| 5,070,303 | 12/1991 | Dent | 328/145 |
| 5,221,907 | 6/1993 | Olsen et al. | 307/492 |

Primary Examiner—John Zazworsky
Attorney, Agent, or Firm—Alan T. McCollom

[57] ABSTRACT

A synchronous progressive-compression type logarithmic amplifier includes one or two channels of amplifier/limiter stages and a corresponding multi-stage synchronous demodulator circuit to provide low noise and/or low power operation as well as other useful operational modes. A preferred embodiment of the invention includes two channels in which the input of a first amplifier stage in each channel forms a logarithmic amplifier input. The synchronous demodulator circuit is realized as a number of multiplier stages each having a first input coupled to the output of a corresponding amplifier stage in the first channel, a second input coupled to the output of a corresponding amplifier stage in the second channel, and a current output. A current summing bus is coupled to the current outputs of each of the multiplier stages, and forms the logarithmic amplifier output. The output voltage of the logarithmic amplifier can be used directly to provide the instantaneous logarithm of the input signal, or can be filtered to provide the logarithm of the envelope of the input signal.

27 Claims, 10 Drawing Sheets

SYNCHRONOUS LOGARITHMIC AMPLIFIER

BACKGROUND OF THE INVENTION

This invention relates generally to logarithmic amplifiers, and, more particularly, to a multi-stage logarithmic amplifier of the "progressive-compression" type including a multi-stage synchronous demodulator circuit.

Progressive-compression type logarithmic amplifiers are well known in the art and are widely employed to provide high-speed response to signals having a large dynamic range, often in applications where an automatic gain control circuit would be inapplicable due to its slow response to changes in signal amplitude. Progressive-compression type logarithmic amplifiers synthesize a logarithmic function through progressive compression of the input signal over many amplifier stages (typically five to ten). Each amplifier stage has a relatively low linear gain (typically two to four) up to some critical level. Above the critical level the incremental gain of the amplifier stage is reduced, and in some cases is zero. Progressive-compression type logarithmic amplifiers are not to be confused with single stage junction-based logarithmic amplifiers, which have severely limited frequency response. The discussion below is limited to progressive-compression type logarithmic amplifiers.

There are two types of logarithmic amplifiers: demodulating and baseband. A demodulating type of logarithmic amplifier 10 (sometimes referred to as a "successive-detection" logarithmic amplifier) is shown in FIG. 1. The input signal received at circuit node 12 is typically a sinusoidal RF signal and the output at circuit node 20 is a signal that is proportional to the logarithm (i.e., the decibel magnitude) of the input signal envelope, which is essentially a measure of the input signal power over an interval that is relatively long in comparison to the period of the input signal.

Demodulating logarithmic amplifier 10 includes a number of serially coupled linear amplifier/limiter stages 14 and a number of detector stages 16 coupled to the output of each amplifier 14, as well as a detector stage 16A coupled to the input of the first amplifier 14. Each detector 16 is typically a rectifier, which is actually realized as a transconductance element based upon the rectifying characteristic of one or more transistors represented by diode 17. The transconductance simplifies the summation o the outputs of each detector 16, since the output signals are in current form. The output current from each detector 16 is summed on current bus 24, converted from a current into a voltage at circuit node 25 by resistor 15 (or a transimpedance amplifier stage), and filtered by low-pass filter 18. It should be noted that detectors stages 16 can be implemented having a voltage output. In that case, a separate voltage summing circuit, rather than a simple current bus, is required to add the voltage outputs.

The DC transfer function of an amplifier/limiter stage 14 is shown in FIG. 1A. The gain of amplifier stage 14 remains linear with a constant gain of A for small signals. At signal input levels above a predetermined knee voltage E, the gain drops to zero. A corresponding label of "A/0" is therefore associated with each amplifier stage 14 shown in FIG. 1. Each amplifier stage 14 can amplify/limit bipolar input signals. The basic equations describing the transfer function are thus:

$$V_{OUT} = AV_{IN} \quad \text{for } -E \leq V_{IN} \leq E \quad [1]$$
$$V_{OUT} = AE \quad \text{for } V_{IN} > E \quad [2]$$
$$V_{OUT} = -AE \quad \text{for } V_{IN} < -E \quad [3]$$

In realizing the synthesized logarithmic output, it is important that the gain A and limiting performance at the knee voltage E of all stages be made as precisely equal as possible.

While a piecewise linear and limiting transfer function is shown in solid lines in FIG. 1A, the more commonly realized hyperbolic tangent transfer function is shown in dashed lines. An amplifier using a simple differential pair of bipolar transistors, for example, has a hyperbolic tangent transfer function, i.e. the differential output current (or voltage with a linear resistive load) divided by the differential input voltage.

The overall synthesized logarithmic output of amplifier 10 is shown in FIG. 1B for eight amplifier/limiter stages. Note that the logarithmic function, which is synthesized with linear amplifiers, is not ideal. An error or "ripple" is present, which is strictly a function of the gain of each amplifier stage. Each "cusp" or transition point in the synthesized function, however, lies directly along a logarithmic curve of the form:

$$V_W = V_Y \log(V_X/V_Z) \quad [4]$$

wherein $V_W$ is the output voltage, $V_X$ is the input voltage, $V_Y$ is the slope voltage, and $V_Z$ is the intercept voltage.

The second type of logarithmic amplifier is the baseband amplifier 20, shown in FIG. 2, which operates according to a similar progressive-compression technique for synthesizing a logarithmic function. The input signal received at circuit node 12 is typically a pulse or other baseband signal, and the output at circuit node 24 is a signal that is proportional to the logarithm of the instantaneous value of the input signal. Some baseband logarithmic amplifiers accept input signals of a single polarity since the ln(x) function contains a singularity at the origin. Other functions, however, which do not contain a singularity and quickly converge to the ln(x) function, such as the $\sinh^{-1}(x)$ function, can be equally easily synthesized using very similar circuit techniques and enable the amplifier to accept bipolar input signals.

Referring now to FIG. 2, baseband logarithmic amplifier 20 includes a number of serially coupled linear amplifier/limiter stages 14 and a number of transconductance stages 19 coupled to the output of each amplifier 14, as well as a transconductance stage 19A coupled to the input of the first amplifier 14. Each stage 19 is typically a linear transconductance element, which again simplifies the summation of the outputs of each stage 19 since the output signal is in current form. The output current from each stage 19 is summed on the current bus 24, and directly converted from a current into an output voltage by resistor 15 at circuit node 25. Again, a transimpedance amplifier can be used in place of resistor 15 to convert the total output current into a voltage.

Both prior logarithmic amplifiers 10 and 20 exhibit a noise problem if bandwidth-limiting filters are not included between each amplifier/limiter stage 14. This is because all noise signals, including self-generated noise signals, that appear at the input 12 or any of the intermediate nodes, are amplified and make a contribution to total output noise at node 25. In a logarithmic amplifier realized using discrete or hybrid technology, such filters can be included and the noise bandwidth minimized. However, these filters complicate the accurate synthesis of the logarithmic function and impose fixed frequency characteristics on the circuit. In integrated form the interstage filters are generally not possible due to the inherent limitations of semiconductor processing technology. Wideband noise, therefore, remains a major problem that can only be minimized through traditional approaches involving tradeoffs, in particular increased power consumption.

It is apparent that neither logarithmic amplifier 10 nor logarithmic amplifier 20 is tunable in integrated form. In the discrete and hybrid versions, the same interstage filters that minimize noise bandwidth can also be tuned to respond to only a predetermined range of input signal frequencies. These filters are not generally realizable in integrated circuits.

The present invention also incorporates a multi-stage synchronous demodulator circuit into the multi-stage progressive-compression logarithmic amplifier. Synchronous demodulator circuits, sometimes referred to as "coherent detectors", are well known in the art and are used to recover information from signals buried in noise. A signal can be recovered even if the signal-to-noise ratio is well below 0 dB. They are widely used in many professional and military applications including radar, sonar, medicine, radio astronomy, and consumer products.

Referring now to FIG. 3 a synchronous demodulator circuit 32 is simply a sign-alternating stage 31, which can be implemented with a multiplier configured as a balanced modulator, followed by a low pass filter 33. The sign-alternating stage 31 has a first input 34 for receiving an input signal, a second input 36 for receiving a clock signal, and an output coupled to the input of the low pass filter 33. The sign-alternating stage 31 has an associated gain, K, assuming a voltage output. The output 38 of the low pass filter 33 provides the demodulated output signal.

In operation, the output signal at node 38 is essentially full wave rectified if the input signal is at the same frequency and phase of the clock signal. In other words, the sign of the input signal is preserved during one clock state, and the sign of the input signal is inverted during the other clock state. If the corner frequency of the low pass filter 33 is well below the frequency of the input Signal, the output of the synchronous demodulator 32 is simply the mean value of the rectified input signal. Note that if the input signal is in quadrature with the clock signal (90° out of phase) the output averages to zero. One important aspect of synchronous demodulators is that additive noise, even high levels of additive noise, traveling on the input signal is not full-wave rectified. It can be shown that the sign-alteration provided by stage 31 does not alter the mean value of the noise, which is zero. In fact, any signal not properly related to the input signal is rejected (averaged to zero). The effectiveness of the rejection of noise depends upon how much time is allowed for the averaging process. Synchronous demodulator circuits are not to be confused with simple absolute value and filter circuits, which do not average additive noise to zero.

What is desired is a novel circuit block that combines the best features of prior art progressive-compression type logarithmic amplifiers and synchronous demodulators to provide a tunable integrated logarithmic amplifier having improved noise performance without interstage filters.

SUMMARY OF THE INVENTION

It is, therefore, an object of the invention to improve the noise performance of progressive-compression logarithmic amplifiers.

Another object of the invention is to lower the power requirements of progressive-compression logarithmic amplifiers.

A further object of the invention is to provide a frequency-selective progressive-compression logarithmic amplifier.

A still further object of the invention is to provide a progressive-compression logarithmic amplifier that can operate in either a demodulating or baseband manner.

A still further object of the invention is to provide a versatile logarithmic amplifier configuration having further additional useful operational modes.

A still further object of the invention is to provide a precision logarithmic amplifier that is readily fabricated on an integrated circuit.

According to the present invention, a preferred embodiment of a synchronous logarithmic amplifier includes two channels each having a number of serially coupled amplifier/limiter stages. The input of a first amplifier stage in each channel forms one of two logarithmic amplifier inputs. An equal number of analog multiplier stages each has a first input coupled to the output of a corresponding amplifier stage in the first channel, a second input coupled to the output of a corresponding amplifier stage in the second channel, and a current output. A current summing bus is coupled to the current outputs of each of the multiplier stages, and forms the logarithmic amplifier output. The output voltage of the logarithmic amplifier can be used directly to provide the instantaneous logarithm of the input signal, or can be filtered to provide the logarithm of the envelope of the input signal.

The preferred embodiment of the synchronous logarithmic amplifier of the present invention includes at least four different modes of operation. In a first mode, the input signal on channel A is a general dynamic input signal, and the input signal on channel B is a DC voltage of either polarity. In this mode, the logarithmic amplifier is essentially a baseband equivalent version of the prior art progressive-compression type logarithmic amplifiers. In a second mode, the input signal on channel A is a general dynamic input signal, the input signal on channel B is a clock signal having a frequency that can be varied over a wide range. In this mode, the amplifier becomes a demodulating logarithmic amplifier with selectivity at a predetermined clock frequency. Frequency components of the input signal not at the clock frequency, or quadrature components thereof, average to zero. In a third mode, the input signal on channel A and channel B are the same. In this mode, the amplifier becomes a self-clocking demodulating logarithmic amplifier with extremely high sensitivity, i.e. the noise floor associated with progressive-compression type logarithmic amplifiers is greatly reduced. This is because the noise of the two channels is completely uncorrelated and the product of these two noise voltages averages to zero. In a fourth mode, the channel A limiter output, which is the output of the last amplifier/limiter in channel A, is bandpass filtered to recover some frequency component of the input, which provides the signal input to the channel B input. In this mode, the amplifier is readily tunable to any frequency set by the bandpass filter. Since the bandpass filter can be an external filter, the frequency of operation is not limited by the constraints of semiconductor process technology.

The foregoing and other objects, features and advantages of the invention will become more readily apparent from the following detailed description of a preferred embodiment of the invention which proceeds with reference to the accompanying drawings.

DETAILED DESCRIPTION

Figure 4:
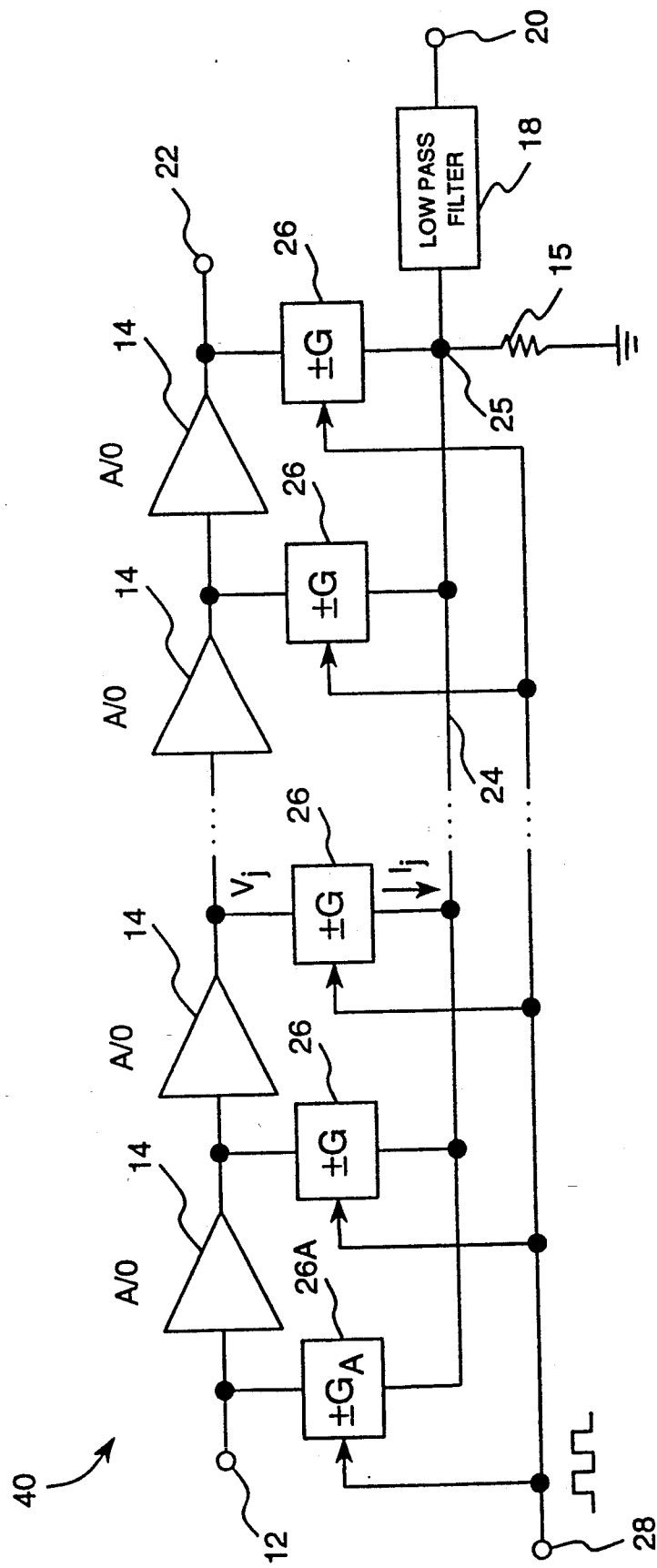
FIG. 4 is a schematic diagram of a first embodiment of the logarithmic amplifier according to the present invention including a multi-stage balanced demodulator circuit.

Referring now to FIG. 4, a first embodiment 40 of a synchronous logarithmic amplifier includes a number of serially coupled amplifier/limiter stages. The input of the first amplifier/limiter stage 14 forms the logarithmic amplifier input at circuit node 12, and the output of the last amplifier/limiter stage forms a limiter output at circuit node 22. In addition to the amplifier/limiter stages 14, amplifier 40 includes a number of multiplier stages 26, which can operate as transconductance stages or balanced modulators. A number of multiplier stages 26 equal to the number of amplifier stages 14 has a first input coupled to the output of a corresponding amplifier/limiter stage 14, a second input for receiving a sign-control signal at circuit node 28, and a current output. Each multiplier stage 26 has a signal voltage input $V_j$, a signal current output $I_j$, and an associated transconductance G.

To extend the dynamic range and for greater accuracy in synthesizing the logarithm function, an additional multiplier stage 26A is included to sum a component from the input stage directly into the output signal. An additional multiplier stage 26A has a first input coupled to the input of the first amplifier/limiter stage 14, a second input for receiving the control signal at circuit node 28, and a current output coupled to the current summing bus 24. The design of multiplier 26A can differ slightly from the other multiplier stages 26. In a refined embodiment the transconductance of multiplier 26A, $G_A$, is greater than the other stages by a factor chosen to improve conformance to the synthesized logarithmic function at the upper end of the dynamic range, according to fundamental analysis. In the preferred embodiment, a factor of $A/(A-1)$ is used. The exact operation of each of the multiplier stages 26 and 26A is further explained below.

A current summing bus 24 is coupled to the current outputs of each of the multiplier stages and forms the logarithmic amplifier output, optionally Converted to a voltage by resistor 15 at circuit node 25. Circuit node 25 is the logarithmic output voltage in a broadband amplifier embodiment. If desired, the multiplier stages 26A can have a voltage output, rather than the current output shown in FIG. 4. In this case, a separate voltage summing circuit (not shown in FIG. 4) is required to provide a voltage output at circuit node 25.

Each multiplier stage 26 operates according to the following formulae:

$I_j = GV_j$ [5], when the input signal at node 28 is high; and
$I_j = -GV_j$ [6], when the input signal at node 28 is low, wherein $I_j$ is the output current, G is the transconductance of the multiplier, and $V_j$ is the input voltage at the jth stage applied to the first input. The designations of "high" and "low" can refer to states of a logic signal, or predetermined DC voltages.

Each multiplier stage 26 and 26A is therefore configured as a simple transconductance stage (if a constant DC bias voltage is applied to input node 28) or a balanced modulator (if a clock voltage is applied to input node 28). A balanced modulator is a circuit in which the sign of the input signal is inverted when the clock signal is low, and the sign of the input signal is preserved when the clock signal is high. The control signal on circuit node 28, therefore, can be either a DC voltage or a clock signal. If a DC voltage is used as the control signal, amplifier 40 is essentially in the same operational mode as prior art progressive-compression logarithmic amplifier 30. If a clock signal is used as the control signal, the amplifier has input signal selectivity around the frequency of the clock signal, i.e. it now operates synchronously.

Figure 1:
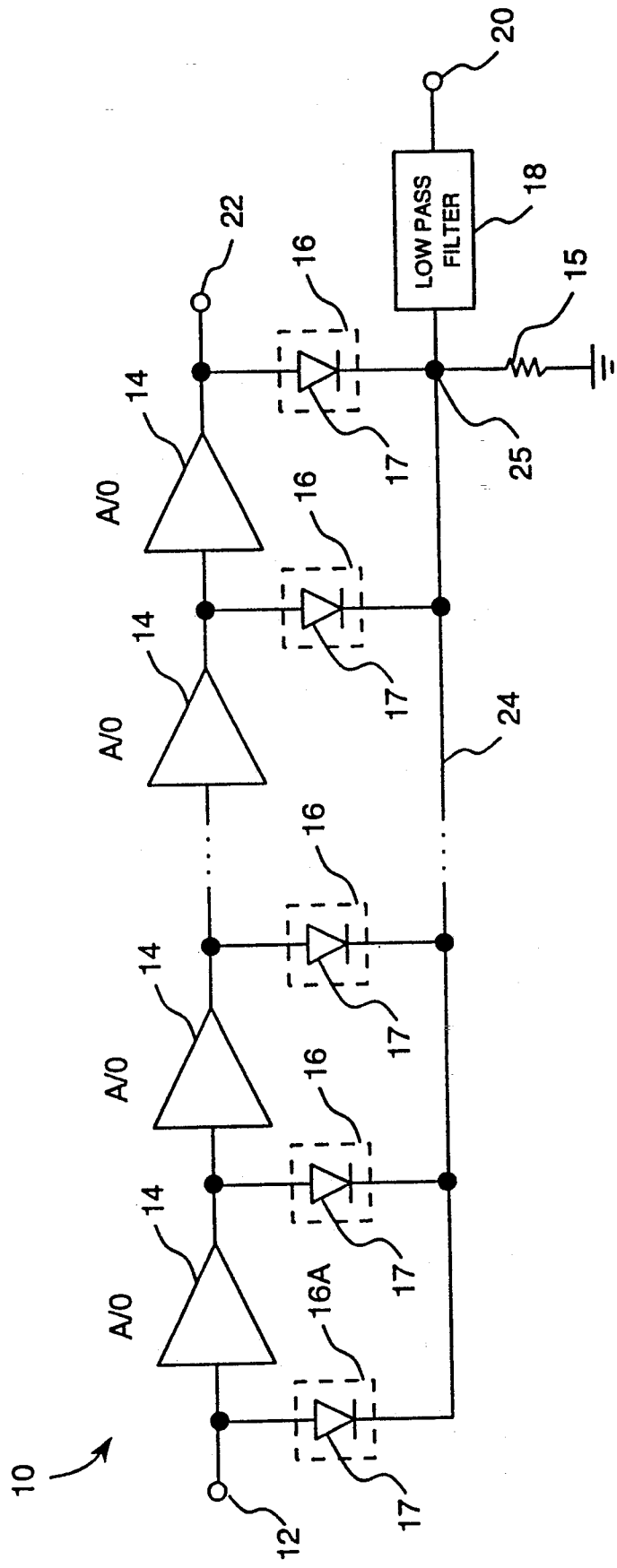
FIG. 1 is a schematic diagram of a prior art demodulating logarithmic amplifier.
Figure 1A:
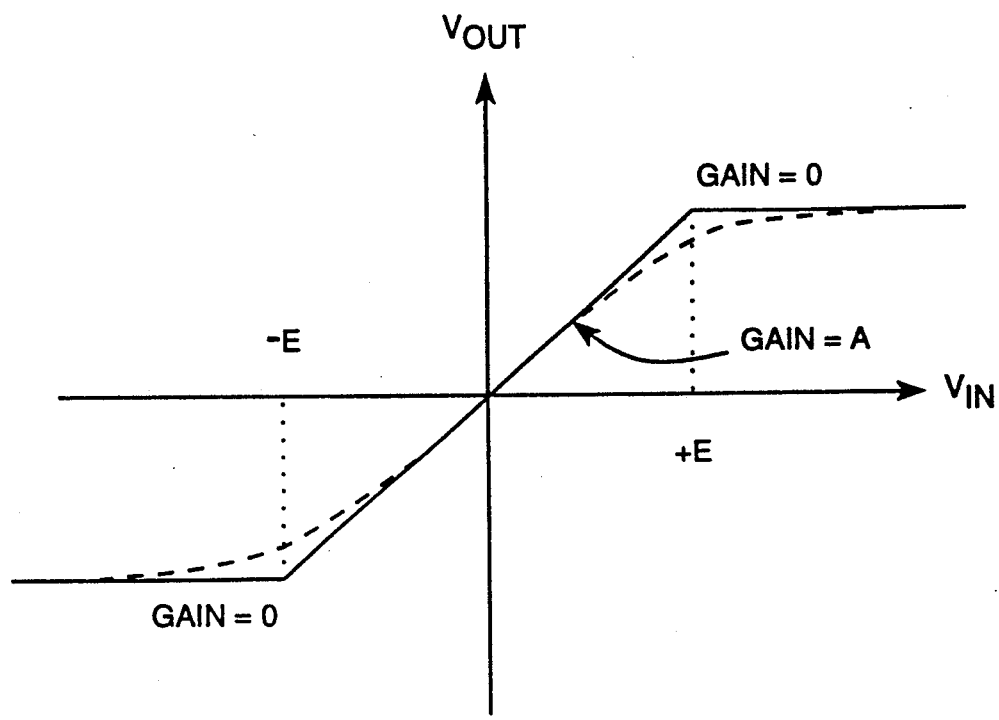
FIG. 1A is a graph of the DC transfer function of an amplifier/limiter stage in the logarithmic amplifier of FIG. 1.
Figure 3:
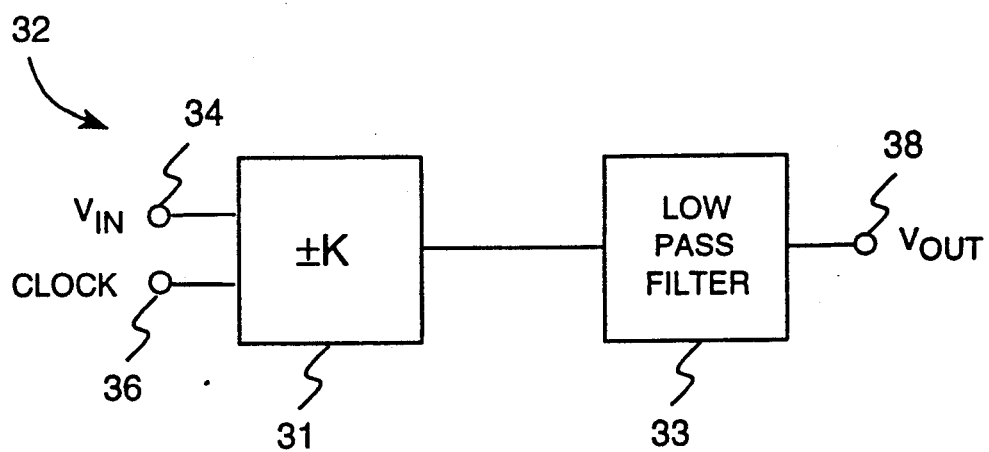
FIG. 3 is a simplified block diagram of a synchronous demodulator.

Each amplifier/limiter stage 14, is designated "A/0" to indicate the predetermined signal amplification (incremental gain=A) and signal limiting characteristic (incremental gain=0). Each amplifier/limiter stage operates either according to equations [1]-[3] described above in the Background of the Invention and shown in solid lines in FIG. 1A, or according to the hyperbolic tangent transfer function shown in dashed lines in FIG. 1A, or according to any other limiting transfer function, i.e. incremental gain equal or tending toward zero at input voltages more positive than the positive knee voltage, E, and at input voltages more negative than the negative knee voltage, $-E$. While the transfer functions of the amplifier/limiter stages shown in FIG. 1A are symmetrical, they need not be symmetrical. In fact, in some applications, in may be desirable to have a first limiting transfer function for positive input voltages, and a second limiting transfer function for negative input voltages.

As in prior art amplifier 10, the synchronous logarithmic amplifier 40 may include a low pass filter 18 having an input for receiving the voltage on circuit node 25 and an output for providing a filtered output signal on output node 20. The output 22 of a last amplifier/limiter stage 14 in the series of amplifier stages provides a limiter output. In general, the signal at the limiter output 22 is forced to the values ±AE in correspondence to the sign of the input signal on node 12 because of the extremely high overall amplifier gain.

One potential problem with amplifier 40 is that there is a finite time delay between the input and output of each of the amplifier/limiter stages 14. This delay time, while not noticeable at lower frequencies, can undesirably affect performance at the highest operational frequencies. This problem is solved by the configuration of amplifier 50 shown in FIG. 5.

Figure 5:
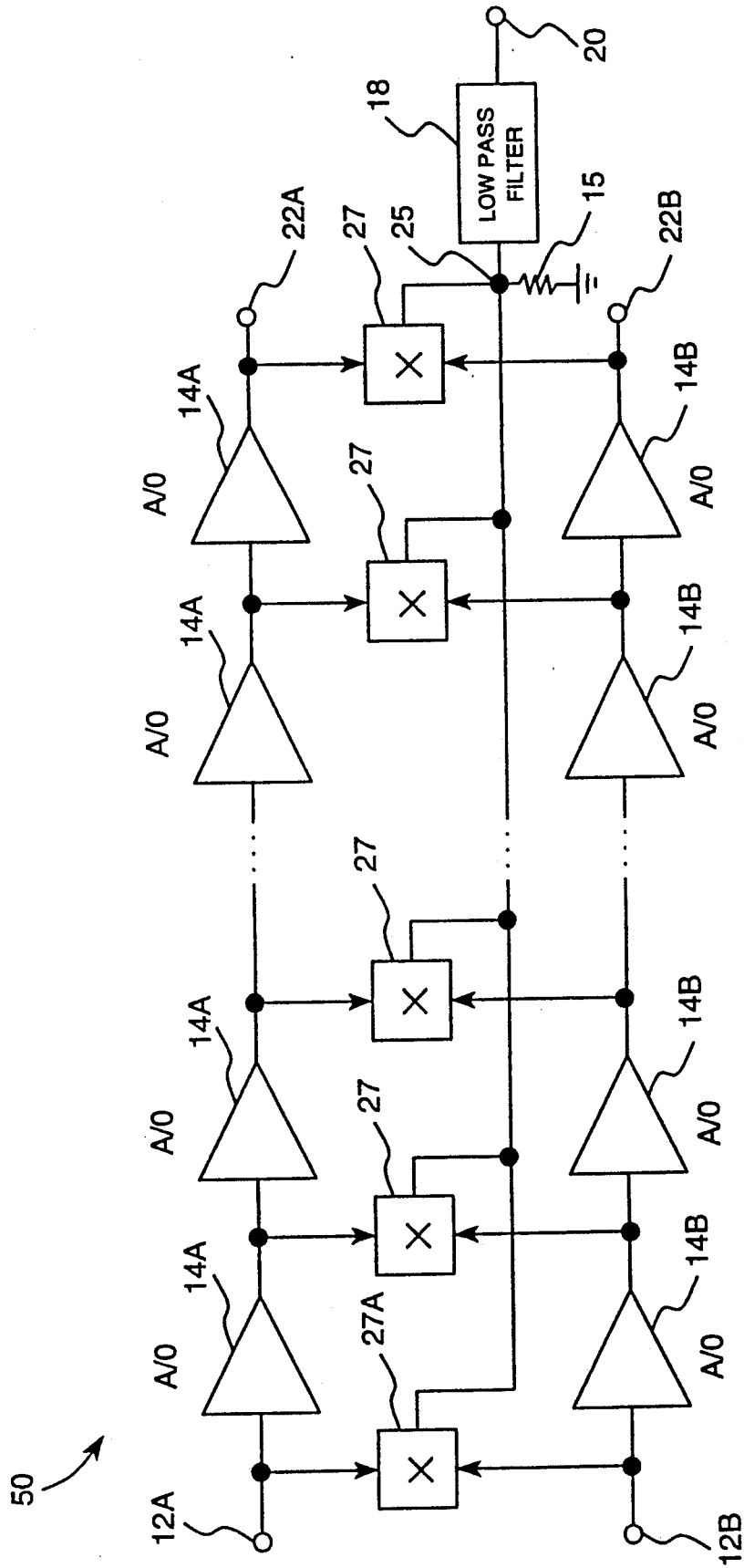
FIG. 5 is a schematic diagram of a second embodiment of the logarithmic amplifier according to the present invention including a multi-stage linear multiplier circuit.

Referring now to FIG. 5, synchronous logarithmic amplifier 50 includes a first channel of serially coupled amplifier/limiter stages 14A. The input of the first amplifier/limiter stage 14A forms the first channel input of logarithmic amplifier 50 at circuit node 12A, and the output of the last amplifier/limiter stage 14B forms a first channel limiter output at circuit node 22A. Synchronous logarithmic amplifier 50 further includes a second channel of serially coupled amplifier/limiter stages 14B. Similarly, the input of the first amplifier/limiter stage 14B forms the second channel input of logarithmic amplifier 50 at circuit node 12B, and the output of the last amplifier/limiter stage 14B forms a second channel limiter output at circuit node 22B. For optimum performance, it is desirable that the time delay through each of the amplifier stages 14A in the first channel be equal to the time delay through each of the amplifier stages 14B in the second channel. It is also desirable that the amplifier stages be designed such that amplifier delay times track accurately, independent of input signal strength and all other operating conditions. Each of the amplifier/limiter stages 14A/14B have a predetermined output signal limiting characteristic according to equations [1]-[3] in the Background of the Invention, a hyperbolic tangent transfer function, or any other limiting transfer function as described above, including non-symmetrical transfer functions.

A number of multiplier stages 27 equal to the number of amplifier/limiter stages in each of the channels has a first input coupled to the output of a corresponding amplifier stage 14A in the first channel, a second input coupled to the output of a corresponding amplifier stage 14B in the second channel, and a current output. As in amplifier 40, a current summing bus 24 is coupled to the current outputs of each of the multiplier stages 27. The multiplier stages 27 can be configured to have a voltage output, but a separate voltage summing circuit (not shown in FIG. 5) is required. The current summing bus 24 forms the logarithmic amplifier output when converted into a voltage at circuit node 25. The voltage conversion is only necessary if a voltage output is desired. An optional low pass filter 18 has an input coupled to the voltage logarithmic amplifier output 25 and an output for providing a filtered output signal at output node 20.

Figure 1B:
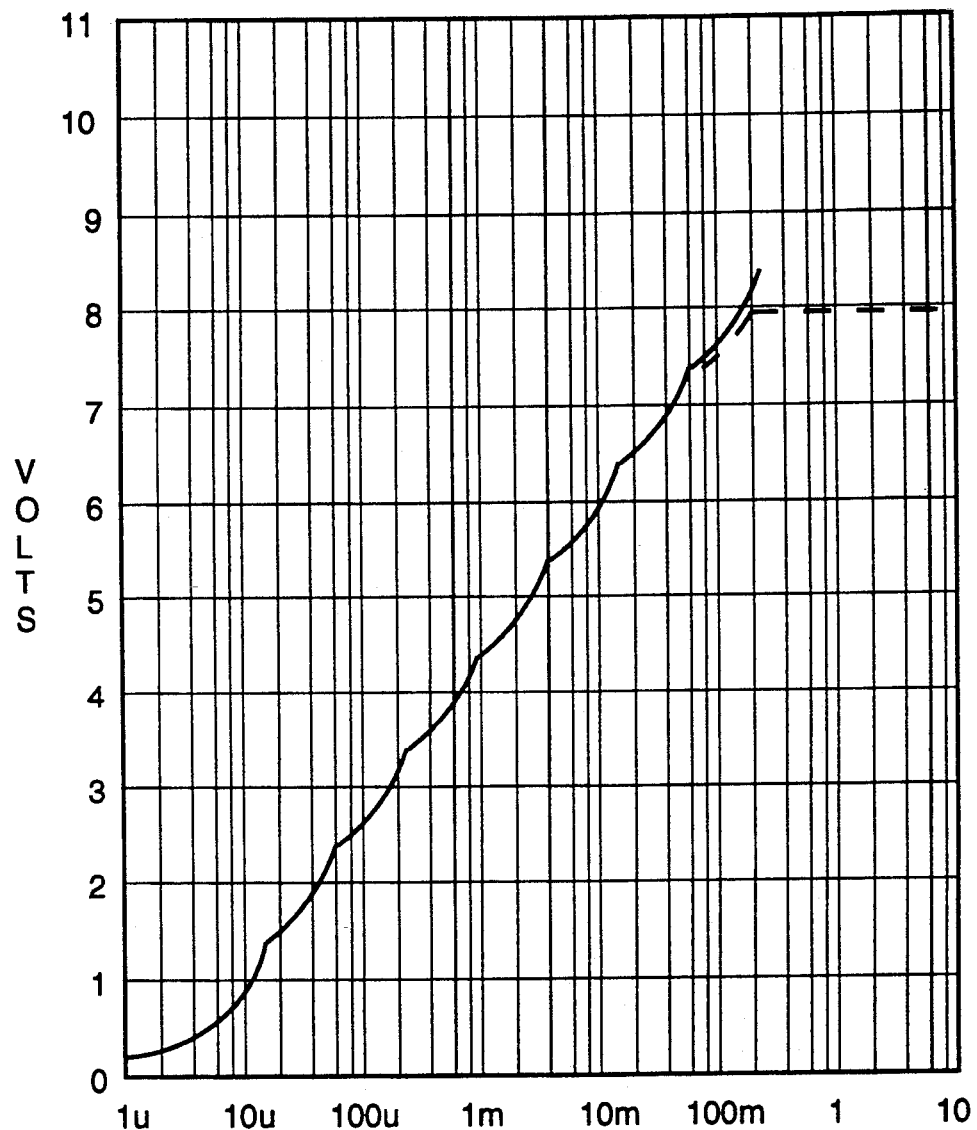
FIG. 1B is a graph of the overall synthesized logarithmic transfer function of the logarithmic amplifier of FIG. 1 having eight amplifier/limiter stages.
Figure 2:
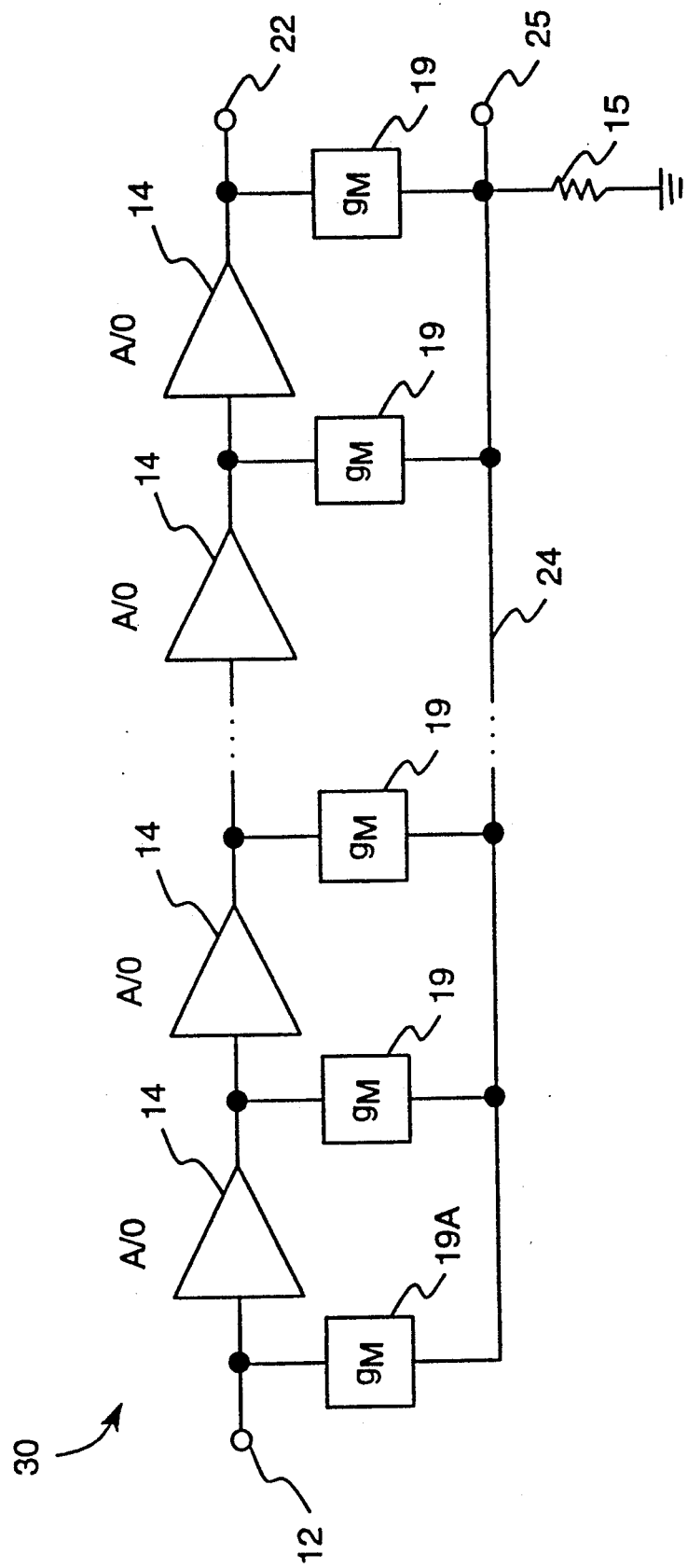
FIG. 2 is a schematic diagram of a prior art baseband logarithmic amplifier.

An additional multiplier stage 27A can be included to extend the dynamic range and to improve the accuracy of the synthesized logarithmic transfer function. The additional multiplier stage has a first input coupled to the input of the first amplifier stage 14A in the first channel, a second input coupled to the input of the first amplifier stage 14B in the second channel, and a current output coupled to the current summing bus 24. Again, the transconductance of multiplier stage 27A is greater than the transconductance of each of the multiplier stages 27 by a constant factor, such as A/(A-1). Referring back to FIG. 1B, the dotted line represents the synthesized logarithmic curve if the first multiplier stage 27A is omitted. Each of the multiplier stages 27 and 27A are essentially two-input, four-quadrant analog multiplier circuits. As a practical matter, all signals (current and voltage) typically, although not necessarily, occur in differential form in amplifier 50.

Figure 6A:
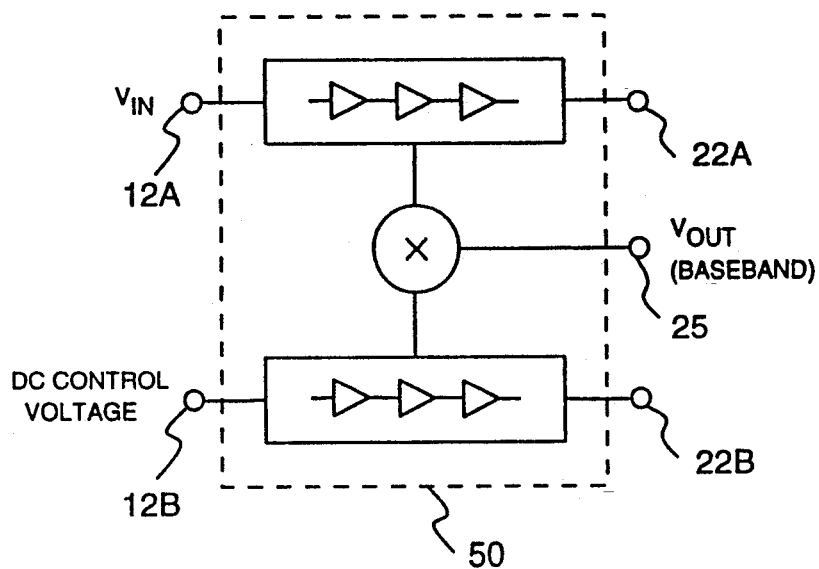
FIGS. 6A-6D are simplified block diagrams of the logarithmic amplifier shown in FIG. 5 configured in four different operational modes.

The synchronous logarithmic amplifier 50 provides at least four different modes of operation having practical importance. In a first mode shown in FIG. 6A, the input signal on channel A is a dynamic input signal, and the input signal on channel B is a DC voltage. Since amplifier 50 is symmetrical, the first and second channels are interchangeable. Therefore, for this mode and subsequent modes, the analysis is the same if the input channels A and B are interchanged. In the first mode, the logarithmic amplifier is essentially a baseband equivalent version of the prior art progressive-compression type logarithmic amplifier. That is, with an input signal on one channel and a DC voltage on the other channel, each multiplier 27 and 27A becomes a transconductance block having an output current proportional to each input signal voltage. In this mode, however, the value of the transconductance can be set by the DC control voltage. This allows the slope of the synthesized logarithmic function to be externally controlled.

Figure 6B:
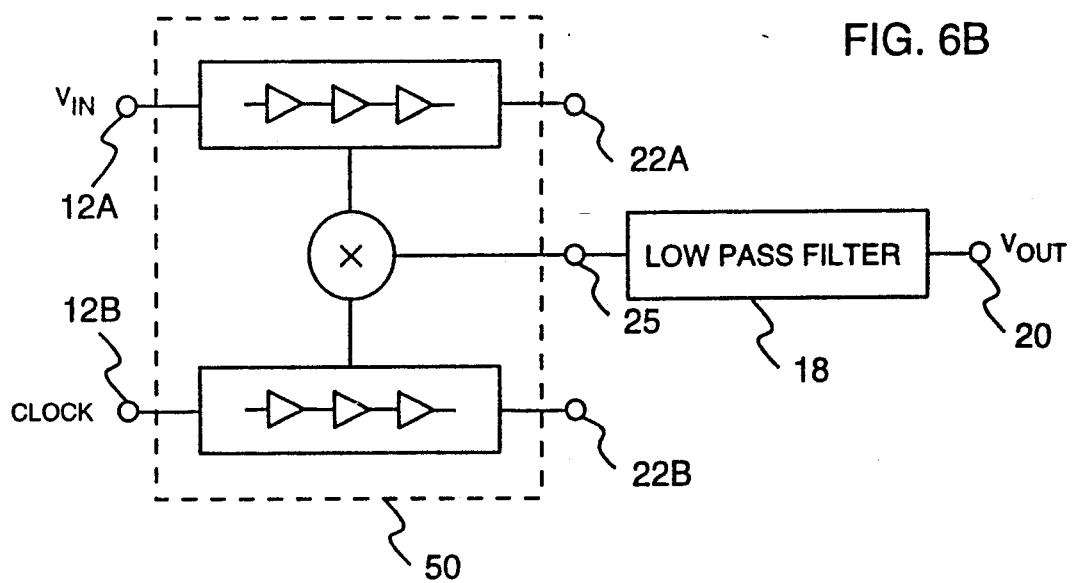

In a second mode shown in FIG. 6B, Synchronous logarithmic amplifier 50 can be configured to provide frequency selectivity. The input signal on channel A is a dynamic input signal and the input signal on channel B is a clock signal having a predetermined clock frequency. Amplifier 50 thus becomes a demodulating logarithmic amplifier with selectivity at the predetermined clock frequency. The output signal of amplifier 50 thus has the general function sgn(B)log(A) or sgn(A)log(B), depending upon which channel receives the input signal and which channel receives the clock signal. The "sgn" function is the sign function, which alternates between a value of +1 and -1, depending upon the sign of the clock input signal. In all synchronous logarithmic amplifiers, the phase of the input signal is very important. Frequency components of the input signal not at the clock frequency, or quadrature components thereof, average to zero. In other words, input signals at the predetermined clock signal that are 90° out of phase with the clock signal will average to zero.

Figure 6C:
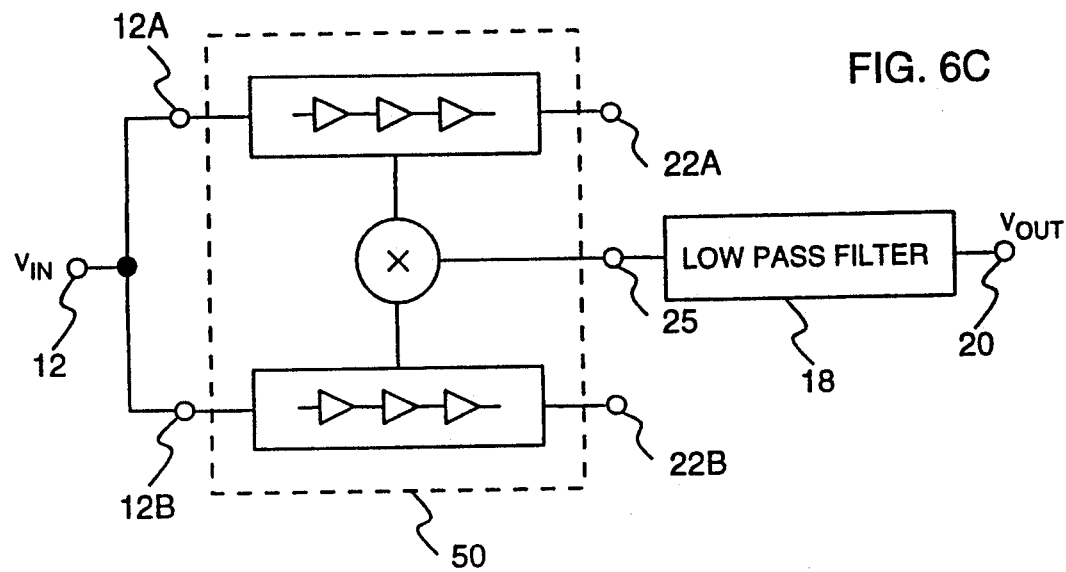

In a third mode shown in FIG. 6C, synchronous amplifier 50 can be configured to have high wideband sensitivity by applying the same signal to the input of both channel A and channel B. Amplifier 50 becomes a self-clocking demodulating logarithmic amplifier with extremely high sensitivity because the noise floor normally associated with wideband progressive-compression type logarithmic amplifiers is greatly reduced. The basic principle for the dramatic improvement in noise performance is that the internally generated noise sources on each channel are uncorrelated, i.e. orthogonal, to one another. If the noise voltage from one channel is multiplied by the noise voltage from the other channel, the average output from the multiplier still has a value of zero. The product of the signal voltages, however, does not average to zero. Since noise performance at a given power level is improved, operating power levels (in particular, bias current values) can be reduced to achieve the same noise performance. It should be noted that only the internally generated noise is uncorrelated between the channel and averages to zero, but that externally generated noise does not average to zero. Another aspect of this high sensitivity mode is that the logarithmic scaling differs somewhat from other modes.

Figure 6D:
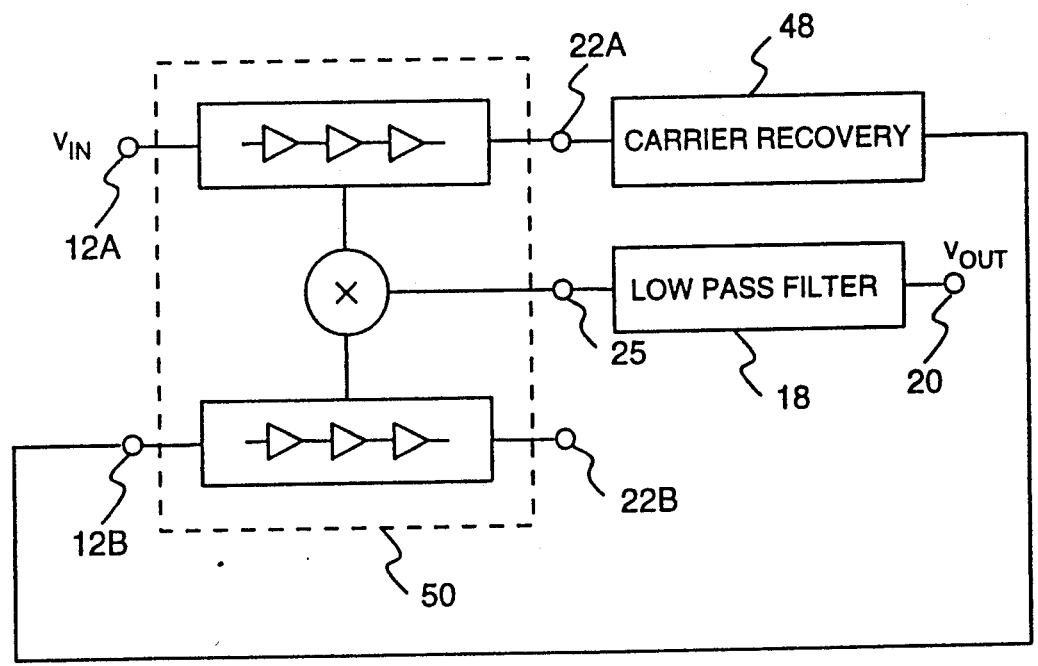

In a fourth mode shown in FIG. 6D, amplifier 50 is configured as a "coherent" logarithmic amplifier that is tunable with an external carrier recovery circuit 48. The channel A limiter output 22A, which is the output of the last amplifier/limiter in channel A, is filtered to provide the signal input to the channel B input. The carrier recovery circuit 48 can be implemented as a simple parallel inductor/capacitor network ("tank circuit") or other well known series or parallel filter configurations. Active circuits can also be used for this purpose, including phase-locked loops. The unfiltered signal at the limiter output 22A is essentially a square wave having a small amount of jitter at the zero crossings, due to the noise on that channel. Once filtered, the input to the second channel at node 12B is an in-phase signal that is essentially free of time-jitter. In this mode, the amplifier is readily tunable to any frequency set by the external filter. Signals at all other frequency are averaged to zero, as in the externally clocked mode. Since the filter can be external, the frequency of operation is not limited by the constraints of semiconductor process technology. The frequency of operation of the tuned synchronous logarithmic amplifier 50 can range from a few hertz to many hundreds of megahertz, merely by the choice of the clock-recovery filter.

Additional operational modes are possible such as a "logarithmic cross-product" mode in which two arbitrary, asynchronous input signals of wide dynamic range are applied to the inputs of the first and second channels. The output waveform is the logarithmic cross-product of the two input signals, which may be useful for signal correlation applications.

Figure 7:
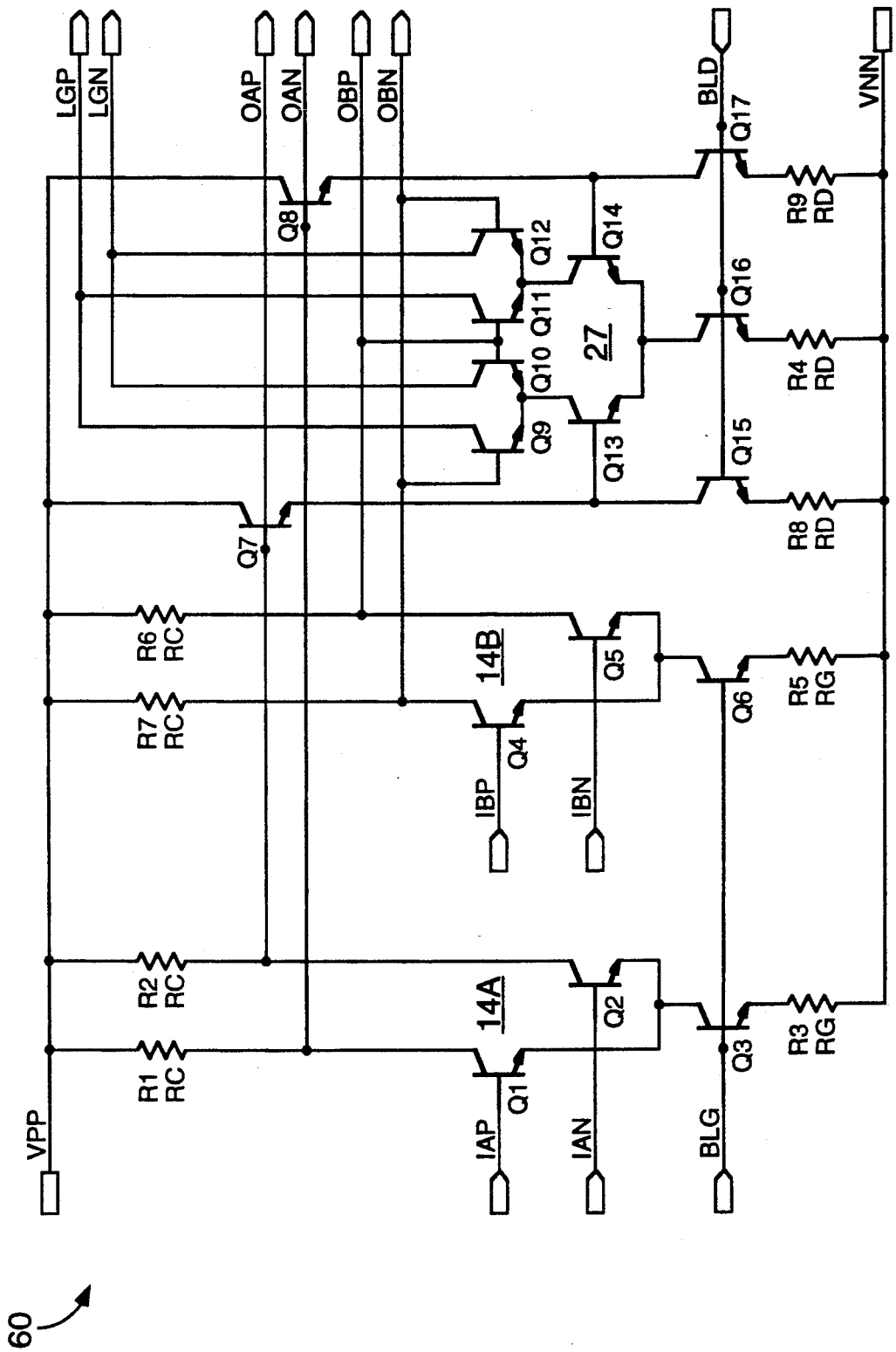
FIG. 7 is a schematic diagram of one stage of an amplifier/limiter/multiplier circuit suitable for use with the amplifiers shown in FIGS. 3 and 4.

Referring now to FIG. 7, the schematic diagram of one cell 60 of amplifier 50 is shown, which includes an amplifier/limiter stage 14A, an amplifier/limiter stage 14B, and a multiplier cell 27 configured in the proper manner with the outputs of the amplifier/limiter stages 14A and 14B coupled to the inputs of the multiplier 27. The inputs and outputs of cell 60 are identified in the table below.

| | |
|---|---|
| VPP | Positive Power Supply Voltage |
| VNN | Negative Power Supply Voltage |
| IAP, IAN | Differential Input Voltage of Stage 14A |
| IBP, IBN | Differential Input Voltage of Stage 14B |
| OAP, OAN | Differential Output Voltage of Stage 14A |
| OBP, OBN | Differential Output Voltage of Stage 14B |
| LGP, LGN | Differential Output Current of Mult. 26 |
| BLG | Bias Voltage for Stages 14A and 14B |
| BLD | Bias Voltage for Multiplier 26 |

Amplifier 14A is a differential amplifier including transistors Q1 and Q2, and load resistors R1 and R2. Bias current is provided from the collector of transistor Q3, and is set with the bias voltage BLG dropped across resistor R3. Similarly, amplifier 14B is a differential amplifier including transistors Q4 and Q5, and load resistors R6 and R7. Bias current is provided from the collector of transistor Q6, and is set with the bias voltage BLG dropped across resistor R5. These amplifiers are designed to operate at a small-signal gain of about $A=3.8$, wherein the load resistors have a nominal value of $RC=4$ kohms, the collector current of transistors Q3 and Q6 is about 100 $\mu A$, and the bias setting resistors have a nominal value of $RG=1.965$ kohms.

The core of the multiplier 27 is transistors Q9–Q12. The signal on the second or B channel is applied directly to the bases of these transistors. The signal on the first or A channel is applied via emitter-follower transistors Q7 and Q8 to the transconductance pair of transistors Q13 and Q14. Bias current is provided via the collectors of transistors Q15–Q17, and is nominally set at 100 $\mu A$. The bias current is set with the value of bias voltage BLD dropped across resistors R8, R4, and R9.

Figure 8:
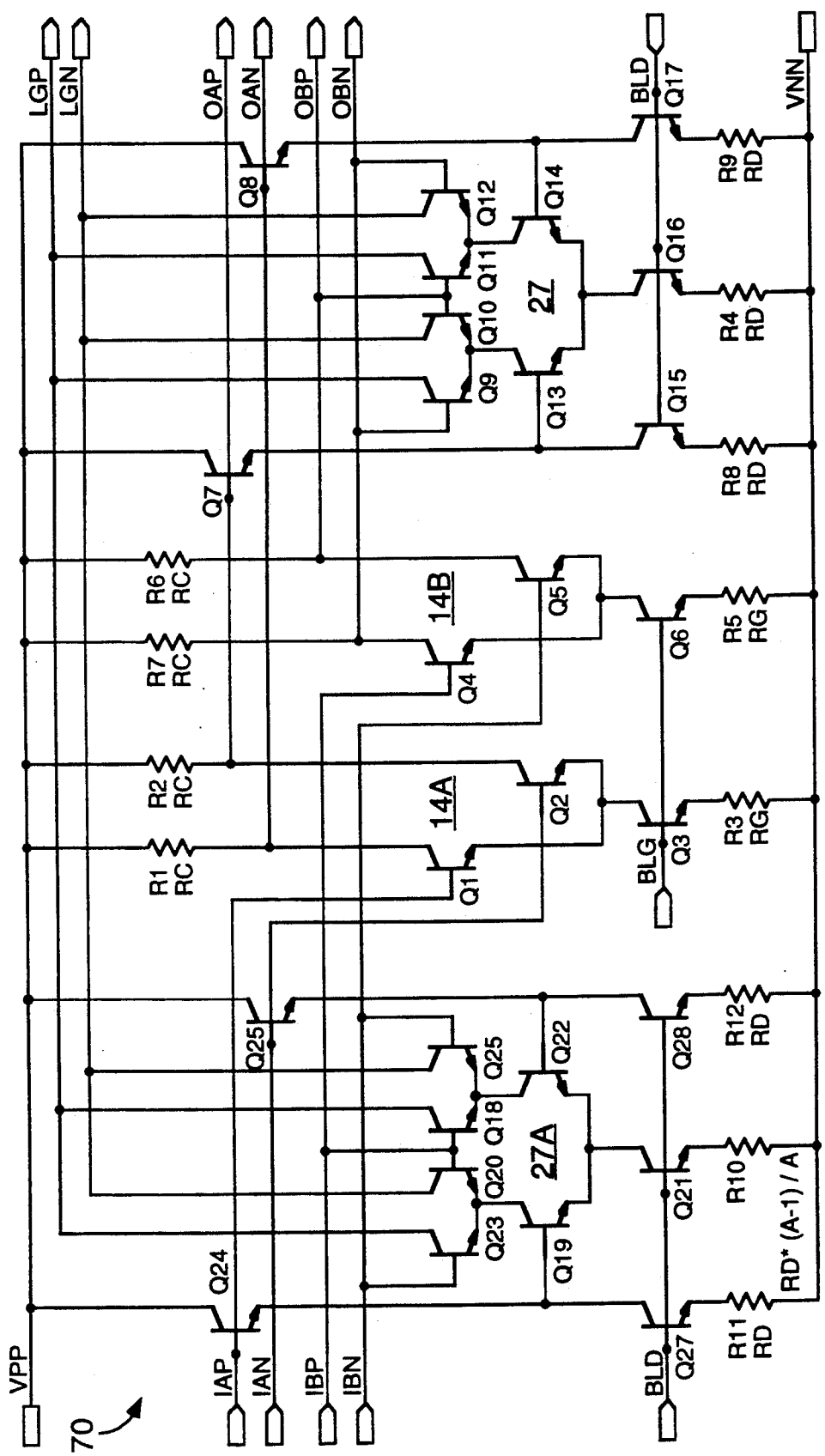
FIG. 8 is a schematic diagram of the first stage of an amplifier/limiter/multiplier circuit suitable for use with the amplifiers shown in FIGS. 3 and 4.

FIG. 8 shows the schematic diagram of the first cell 70 of amplifier 50, which includes the first multiplier cell 27A, an amplifier/limiter stage 14A, an amplifier/limiter stage 14B, and the second multiplier cell 27 configured in the proper manner. The inputs and outputs of cell 70 are the same as those of cell 60. The difference between the first and second multiplier cells is that the transconductance of the first multiplier cell is set to be a factor such as $A/(A-1)$ times the transconductance of the second and subsequent multiplier cells for greater accuracy in the synthesis of the overall logarithmic function. To realize the increase in transconductance, each current setting resistor R11, R10, and R12 in the first multiplier 27 is set to be equal to $(A-1)/A$ times that of the current setting resistors in the second and subsequent multipliers.

Having described and illustrated the principles of the invention in a preferred embodiment thereof, it is apparent to those skilled in the art that the invention can be modified in arrangement and detail without departing from such principles. I therefore claim all modifications and variation coming within the spirit and scope of the following claims.

I claim:

1. A logarithmic amplifier (40) comprising:
   a plurality of N serially coupled amplifier stages (14) each having an input and an output, wherein N is an integer greater than one, and wherein the input of a first amplifier stage forms a logarithmic amplifier input;
   a plurality of N multiplier stages (26) each having a first input coupled to the output of a corresponding amplifier stage, a second input for receiving a control signal, and an output; and
   summing means (24) having a plurality of inputs coupled to the outputs of each of the multiplier stages and an output forming a logarithmic amplifier output.

2. A logarithmic amplifier (40) as in claim 1 in which output of each of the multiplier stages (26) comprises a current output and the summing means comprises a current summing bus (24) coupled to the current outputs of each of the multiplier stages, the current summing bus forming the logarithmic amplifier output.

3. A logarithmic amplifier (40) as in claim 1 further comprising an (N+1)th multiplier stage having a first input coupled to the input of the first amplifier stage, a second input for receiving the control signal, and a current output coupled to the current summing bus.

4. A logarithmic amplifier (40) as in claim 1 in which each of the amplifier stages comprise an amplifier stage having a hyperbolic tangent transfer function.

5. A logarithmic amplifier (40) as in claim 1 in which each of the amplifier stages comprise a linear amplifier stage having a predetermined output signal limiting characteristic.

6. A logarithmic amplifier (40) as in claim 5 in which the linear amplifier comprises a voltage amplifier having an input voltage $V_{IN}$ and an output voltage $V_{OUT}$, such that $V_{OUT}=AV_{IN}$ for $V_{IN}$ less than or equal to E and VIN greater than or equal to $-E$, $V_{OUT}=AE$ for $V_{IN}$ greater than E, and $V_{OUT}=-AE$ for $V_{IN}$ less than $-E$, wherein A is a rational number greater than 1 and E is a predetermined input voltage.

7. A logarithmic amplifier (40) as in claim 1 in which each of the multiplier stages comprise a balanced modulator.

8. A logarithmic amplifier (40) as in claim 1 further comprising a low pass filter (18) having an input coupled to the logarithmic amplifier output and an output for providing a demodulated output signal.

9. A logarithmic amplifier (40) as in claim 1 in which the output of a last amplifier stage in the series of amplifier stages forms a limiter output.

10. A logarithmic amplifier (40) as in claim 1 in which the control signal comprises a clock signal.

11. A logarithmic amplifier (40) as in claim 1 in which the control signal comprises an output signal at the logarithmic amplifier output.

12. A logarithmic amplifier (50) comprising:
a first channel including a plurality of N serially coupled amplifier stages (14A) each having an input and an output, wherein N is an integer greater than one, and wherein the input of a first amplifier stage forms a first channel input of the logarithmic amplifier;
a second channel including a plurality of N serially coupled amplifier stages (14B) each having an input and an output, wherein the input of a first amplifier stage in the series of amplifier stages forms a second channel input of the logarithmic amplifier;
a plurality of N multiplier stages (27) each having a first input coupled to the output of a corresponding amplifier stage in the first channel, a second input coupled to the output of a corresponding amplifier stage in the second channel, and an output; and
summing means (24) having a plurality of inputs coupled to the outputs of each of the multiplier stages and an output forming a logarithmic amplifier output.

13. A logarithmic amplifier (50) as in claim 12 in which the output of each of the multiplier stages (27) comprises a current output and the summing means comprises a current summing bus (24) coupled to the current outputs of each of the multiplier stages, the current summing bus forming a logarithmic amplifier output.

14. A logarithmic amplifier (50) as in claim 12 further comprising an (N+1)th multiplier stage having a first input coupled to the input of the first amplifier stage in the first channel, a second input coupled to the input of the first amplifier stage in the second channel, and a current output coupled to the current summing bus.

15. A logarithmic amplifier (40) as in claim 12 in which each of the amplifier stages comprise an amplifier stage having a hyperbolic tangent transfer function.

16. A logarithmic amplifier (50) as in claim 12 in which each of the amplifier stages comprise a linear amplifier stage having a predetermined output signal limiting characteristic.

17. A logarithmic amplifier (50) as in claim 16 in which the linear amplifier comprises a voltage amplifier having an input voltage $V_{IN}$ and an output voltage $V_{OUT}$, such that $V_{OUT}=AV_{IN}$ for $V_{IN}$ less than or equal to E and VIN greater than or equal to $-E$, $V_{OUT}=AE$ for $V_{IN}$ greater than E, and $V_{OUT}=-AE$ for $V_{IN}$ less than $-E$, wherein A is a rational number greater than 1 and E is a predetermined input voltage.

18. A logarithmic amplifier (50) as in claim 12 in which each of the multiplier stages comprise a two-input, four-quadrant multiplier.

19. A logarithmic amplifier (50) as in claim 12 further comprising a low pass filter (18) having an input coupled to the logarithmic amplifier output and an output for providing a demodulated output signal.

20. A logarithmic amplifier (50) as in claim 12 in which the output of a last amplifier stage in the first channel forms a first channel limiter output.

21. A logarithmic amplifier (50) as in claim 12 in which the output of a last amplifier stage in the second channel forms a second channel limiter output.

22. An amplification method comprising the steps of:
providing a first amplifier channel including a plurality of N serially coupled amplifier stages (14A) each having an input and an output, wherein N is an integer greater than one, and wherein the input of a first amplifier stage forms a first channel input;
supplying a first input signal to the first channel input;
providing a second channel including a plurality of N serially coupled amplifier stages (14B) each having an input and an output, wherein the input of a first amplifier stage in the series of amplifier stages forms a second channel input;
supplying a second input signal to the second channel input;
multiplying a signal at the output of an amplifier stage in the first channel together with a signal at the output of a corresponding amplifier stage in the second channel to provide a plurality of N outputs; and
summing the outputs of each of the multiplier stages to provide an output signal.

23. The amplification method of claim 22 further comprising the steps of:
multiplying a signal at the input of the first amplifier stage in the first channel together with a signal at the input of the first amplifier stage in the second channel to provide an additional output; and
summing the additional output with the output signal to provide a more accurate output signal.

24. The amplification method of claim 22 in which the step of supplying a first input signal comprises the step of supplying a dynamic input signal, and in which the step of supplying a second input signal comprises the step of supplying a time-invariant input signal.

25. The amplification method of claim 22 in which the step of supplying a first input signal comprises the step of supplying a dynamic input signal having a predetermined fundamental frequency, and in which the step of supplying a second input signal comprises the step of supplying a clock signal having a frequency substantially equal to the predetermined fundamental frequency.

26. The amplification method of claim 22 in which the step of supplying first and second input signals comprises the step of supplying an identical input signal to the first and second channel inputs.

27. The amplification method of claim 22 further comprising the steps of:
provising a limiter output signal at the output of an amplifier stage in the first channel; and
filtering the limiter output signal to provide the second input signal.

* * * * *

UNITED STATES PATENT AND TRADEMARK OFFICE
CERTIFICATE OF CORRECTION

PATENT NO. : 5,298,811
DATED : March 29, 1994
INVENTOR(S) : Barry Gilbert

It is certified that error appears in the above-indentified patent and that said Letters Patent is hereby corrected as shown below:

Column 1, line 51, change "summation o" to --summation of--;

Column 3, line 50, change "Signal" to --signal--;

Column 6, line 13, change "Converted" to --converted--.

Signed and Sealed this

Twenty-first Day of May, 1996

Attest:

BRUCE LEHMAN

*Attesting Officer*   *Commissioner of Patents and Trademarks*